(12) United States Patent
Deng et al.

(10) Patent No.: US 10,396,046 B2
(45) Date of Patent: Aug. 27, 2019

(54) SUBSTRATE ASSEMBLY WITH MAGNETIC FEATURE

(71) Applicant: Intel Corporation, Santa Clara, CA (US)

(72) Inventors: Yikang Deng, Chandler, AZ (US); Robert Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/859,316

(22) Filed: Dec. 29, 2017

(65) Prior Publication Data

US 2019/0206814 A1 Jul. 4, 2019

(51) Int. Cl.
| | |
|---|---|
| *H01F 27/00* | (2006.01) |
| *H01L 23/64* | (2006.01) |
| *H01L 23/00* | (2006.01) |
| *H01F 27/28* | (2006.01) |
| *H05K 1/02* | (2006.01) |

(52) U.S. Cl.
CPC ........... *H01L 23/645* (2013.01); *H01F 27/28* (2013.01); *H01L 24/16* (2013.01); *H05K 1/025* (2013.01); *H01L 2224/16265* (2013.01); *H01L 2924/1427* (2013.01); *H01L 2924/19042* (2013.01); *H01L 2924/19104* (2013.01)

(58) Field of Classification Search
CPC ....... H05K 1/025; H01L 23/645; H01L 24/16; H01L 2224/16265; H01L 2924/1427; H01L 2924/19042; H01L 2924/19104; H01F 27/28
See application file for complete search history.

(56) References Cited

U.S. PATENT DOCUMENTS

| | | | | |
|---|---|---|---|---|
| 9,966,186 | B1* | 5/2018 | Peng | H01F 10/132 |
| 2009/0207574 | A1* | 8/2009 | Chen | H05K 1/181 |
| | | | | 361/761 |
| 2010/0026443 | A1* | 2/2010 | Yan | H01F 17/0013 |
| | | | | 336/234 |
| 2011/0050334 | A1* | 3/2011 | Pan | H01L 23/642 |
| | | | | 327/564 |

(Continued)

OTHER PUBLICATIONS

Office Action from German Patent Application No. 102018129890.0 dated Apr. 11, 2019, 10 pages.

*Primary Examiner* — Steven T Sawyer
(74) *Attorney, Agent, or Firm* — Schwabe, Williamson & Wyatt P.C.

(57) ABSTRACT

Apparatuses, systems and methods associated with substrate design with a magnetic feature for fully integrated voltage regulator are disclosed herein. In embodiments, a substrate assembly may include a base substrate and one or more interconnect elements located at a first side of the base substrate, the one or more interconnect elements to be coupled to a semiconductor chip having an integrated voltage regulator (IVR). The substrate assembly may further include a magnetic feature located at a second side of the base substrate, the second side being opposite to the first side, wherein the magnetic feature extends along a portion of the second side of the base substrate that is opposite to where the IVR is to be located when the semiconductor chip is coupled to the one or more interconnect elements. Other embodiments may be described and/or claimed.

14 Claims, 8 Drawing Sheets

(56) References Cited

U.S. PATENT DOCUMENTS

| | | | |
|---|---|---|---|
| 2011/0291785 A1* | 12/2011 | Lim | H01F 27/2804 336/200 |
| 2013/0175664 A1* | 7/2013 | de Rochemont | B82Y 30/00 257/531 |
| 2014/0264732 A1 | 9/2014 | Elsherbini | |
| 2014/0293529 A1* | 10/2014 | Nair | H01Q 1/2291 361/679.31 |
| 2015/0036308 A1 | 2/2015 | Sturcken | |
| 2016/0036330 A1 | 2/2016 | Sturcken et al. | |
| 2016/0104665 A1 | 4/2016 | Cho et al. | |
| 2017/0179094 A1* | 6/2017 | Min | H01L 23/49827 |
| 2017/0229963 A1 | 8/2017 | Zeng | |

\* cited by examiner

SUBSTRATE ASSEMBLY WITH MAGNETIC FEATURE

TECHNICAL FIELD

The present disclosure relates to the field of electronic circuits. More particularly, the present disclosure relates to substrate design with a magnetic feature for fully integrated voltage regulator.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Advancements in power delivery efficiency have led to fully integrated voltage regulators (FIVRs) being implemented in semiconductor devices. However, the performance of legacy FIVRs implemented in semiconductor devices is limited by the dielectric material surrounding an area where the FIVR is located within a semiconductor chip. A legacy approach to addressing the limitation of performance was to apply magnetic film across the full area of the substrate assembly, wherein a coil of the FIVR was located around the substrate assembly. However, this legacy approach may impact the signal integrity of high speed signals due to the presence of the magnetic material. Further, the lamination of the magnetic film in the substrate assembly increases the difficulty in manufacturing the substrate assembly.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
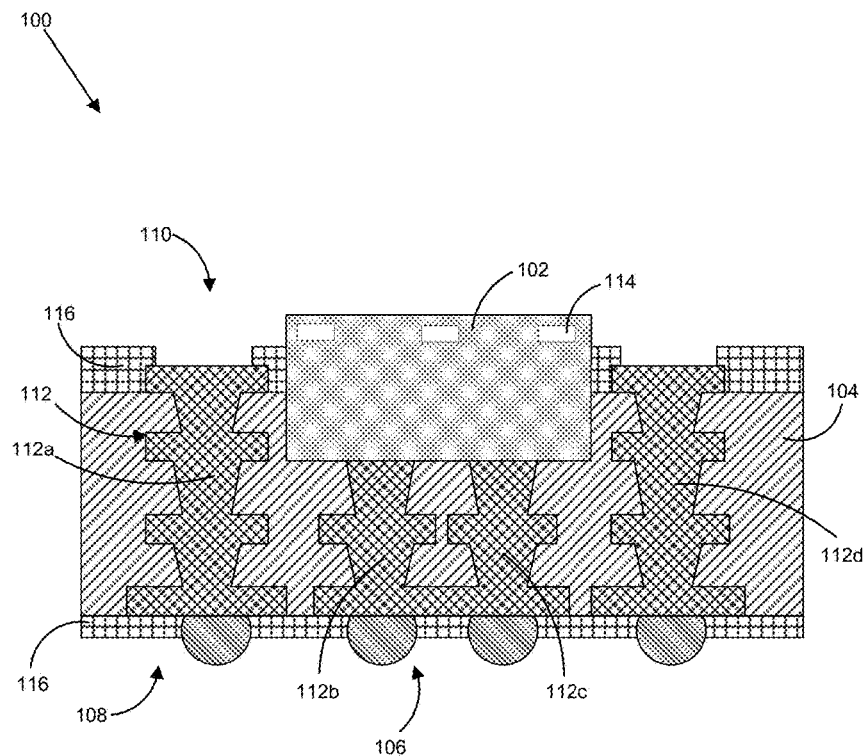
FIG. 1 illustrates a cross-sectional view of an example substrate assembly with magnetic feature, according to various embodiments.

Apparatuses, systems and methods associated with substrate design with a magnetic feature for fully integrated voltage regulator are disclosed herein. In embodiments, a substrate assembly may include a base substrate and one or more interconnect elements located at a first side of the base substrate, the one or more interconnect elements to be coupled to a semiconductor chip having an integrated voltage regulator (IVR). The substrate assembly may further include a magnetic feature located at a second side of the base substrate, the second side being opposite to the first side, wherein the magnetic feature extends along a portion of the second side of the base substrate that is opposite to where the IVR is to be located when the semiconductor chip is coupled to the one or more interconnect elements.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a cross-sectional view of an example substrate assembly 100 with magnetic feature 102, according to various embodiments. The substrate assembly 100 may include a base substrate 104. The base substrate 104 may include a dielectric material. Further, in some embodiments, the base substrate 104 may include one or more build-up films. The build-up films may include dielectric material and may be epoxy-based in some embodiments.

The base substrate 104 may include one or more conductive elements 112, such as vias, traces, pads, or some combination thereof. The conductive elements 112 may include conductive material, such as copper, silver, gold, aluminum, zinc, nickel, tin, or some combination thereof. The conductive elements 112 may extend from interconnect elements 106 located at a first side 108 of the substrate assembly 100 to a second side 110 of the substrate assembly 100, and/or to the magnetic feature 102. One or more of the interconnect elements 106 may form a pattern on the second side 110 of the substrate assembly 100, wherein the pattern may be a copper pattern. In the illustrated embodiment, the base substrate 104 may include a first conductive element 112a, a second conductive element 112b, a third conductive element 112c, and a fourth conductive element 112d. The first conductive element 112a and the fourth conductive element 112d may extend from corresponding ones of the interconnect elements 106, located at the first side 108 of the substrate assembly 100, to the second side 110 of the substrate assembly 100. The second conductive element 112b and the third conductive element 112c may extend from corresponding ones of the interconnect elements 106, located at the first side 108 of the substrate assembly 100, to the magnetic feature 102, located at the second side 110 of the substrate assembly 100. In other embodiments, the second conductive element 112b and the third conductive element 112c may extend into and/or through the magnetic feature 102.

The substrate assembly 100 may further include one or more interconnect elements 106 located at the first side 108 of the substrate assembly 100. The interconnect elements 106 may be utilized for mounting the substrate assembly 100 to a semiconductor chip with an integrated voltage regulator. In the illustrated embodiment, the interconnect elements 106 are illustrated as solder balls, which form a ball-grid array. However, it is to be understood that the interconnect elements 106 may comprise any type of interconnect element that may be utilized for mounting a substrate to a semiconductor chip, such as wires, pads, and other similar interconnect elements.

The substrate assembly 100 may further include the magnetic feature 102. The magnetic feature 102 may be located at the second side 110 of the substrate assembly 100. In some embodiments, the magnetic feature 102 may be located on the pattern formed by the conductive elements 112, which may be a copper pattern. Further, the magnetic feature 102 may extend into the base substrate 104. The magnetic feature 102 may comprise a magnetic material, and may comprise a ferromagnetic material in some embodiments. The magnetic feature 102 may extend across only a portion of the second side 110 of the substrate assembly 100. In particular, the magnetic feature 102 may be located only in locations that improve inductance of an inductor associated with the voltage regulator of the semiconductor chip. For example, the magnetic feature 102 may extend across only a portion of the second side 110 where coil elements 114 are located. The magnetic feature 102 may be located on an opposite side of the substrate assembly from where the semiconductor chip with the integrated voltage regulator is to be coupled.

The substrate assembly 100 may further include a coil. The coil may include one or more coil elements 114 (as indicated by the rectangles shown in FIG. 1) that extend through the magnetic feature 102. In particular, the coil elements 114 may extend through the magnetic feature 102 from a first side of the magnetic feature 102 to a second side of the magnetic feature 102. The magnetic feature 102 may encapsulate the portions of the coil elements 114 that extend through the magnetic feature 102. The coil elements 114 may include copper. Each of the coil elements 114 may comprise a thin strip of copper and/or a copper wire. Further, each of the coil elements 114 may extend parallel to the other coil elements of the coil elements 114.

Portions of the coil elements 114 may extend outside of the magnetic feature 102 on both the first side of magnetic feature 102 and the second side of the magnetic feature 102, wherein the portions of the coil elements 114 may be coupled to the corresponding ones of the conductive elements 112. The conductive elements 112 to which the coil elements 114 are coupled may extend through the base substrate 104 to interconnect elements 106 located at a first side 108 of the substrate assembly 100, wherein the interconnect elements 106 are to couple to the voltage regulator within the semiconductor chip. The coil elements 114, the conductive elements 112, and the interconnect elements 106 may form the coil associated with the voltage regulator.

The substrate assembly 100 may further include surface finish 116. The surface finish 116 may be located at both the first side 108 and the second side 110 of the substrate assembly 100. The surface finish 116 may extend across portions of the first side 108 and the second side 110 at which the magnetic feature 102, the conductive elements 112, and the interconnect elements 106 are not located. The surface finish 116 may protect the base substrate 104 from damage. In some embodiments, the surface finish 116 may be omitted.

Figure 2:
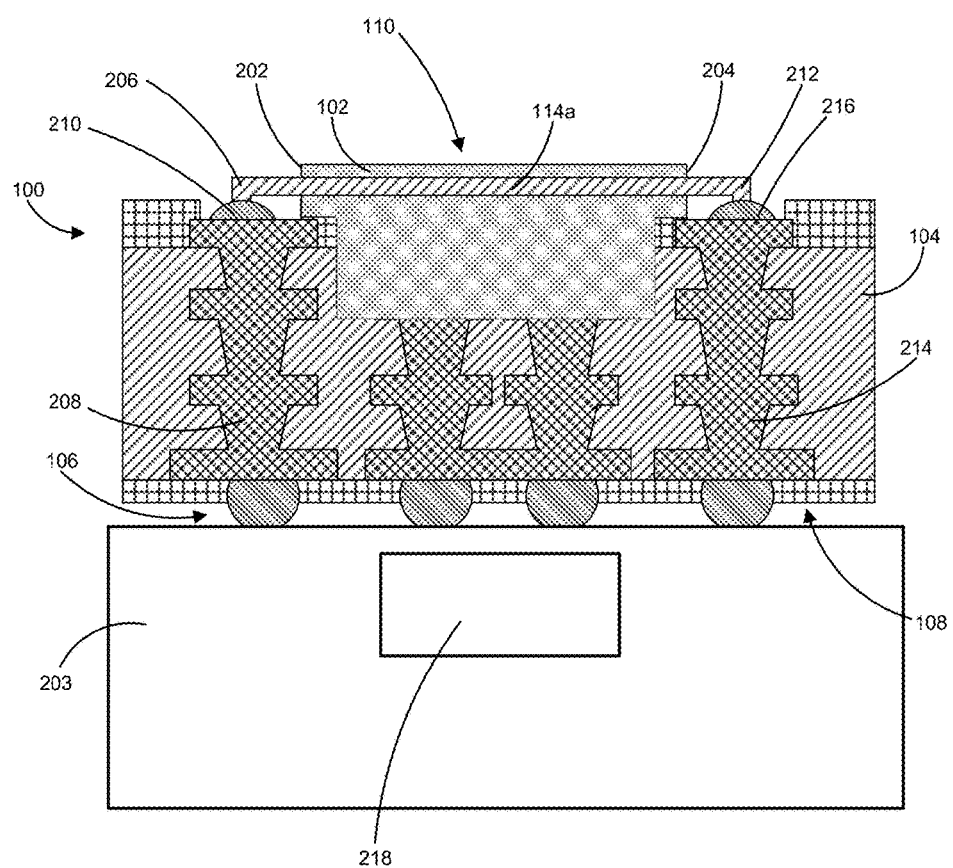
FIG. 2 illustrates a cross-sectional view of the example substrate assembly mounted to a microprocessor chip, according to various embodiments.

FIG. 2 illustrates a cross-sectional view of the example substrate assembly 100 mounted to a microprocessor chip 203, according to various embodiments. In particular, the cross-sectional view of FIG. 2 may be represented at 90 degrees from the cross-sectional view of FIG. 1. Further, for simplicity, the description of FIG. 2 may refer to a single coil element 114a. It is to be understood that the single coil element 114a may be representative of the others of the coil elements 114 within the substrate assembly 100.

The coil element 114a may extend through the magnetic feature 102 from a first side 202 of the magnetic feature 102 to a second side 204 of the magnetic feature 102. A first portion 206 of the coil element 114a may extend out of the magnetic feature 102 at the first side 202. The first portion 206 of the coil element 114a may be coupled to a first conductive element 208 via a first interconnect element 210. The first conductive element 208 may include one or more of the features of the conductive elements 112 (FIG. 1). Further, the first interconnect element 210 may include one or more of the features of the interconnect elements 106 (FIG. 1). The first conductive element 208 may extend from the first interconnect element 210 located at the second side 110 of the substrate assembly 100 to one of the interconnect elements 106 located at the first side 108 of the substrate assembly 100. The one of the interconnect elements 106 may couple the first conductive element 208 to the microprocessor chip 203.

A second portion 212 of the coil element 114a may extend out of the magnetic feature 102 at the second side 204. The second portion 212 of the coil element 114a may be coupled to a second conductive element 214 via an interconnect element 216. The second conductive element 214 may include one or more of the features of the conductive elements 112. Further, the second interconnect element 216 may include one or more of the features of the interconnect elements 106. The second conductive element 214 may extend from the second interconnect element 216 located at the second side 110 of the substrate assembly 100 to one of the interconnect elements 106 located at the first side 108 of the substrate assembly 100. The one of the interconnect elements 106 may couple the second conductive element 214 to the microprocessor chip 203.

Figure 13:
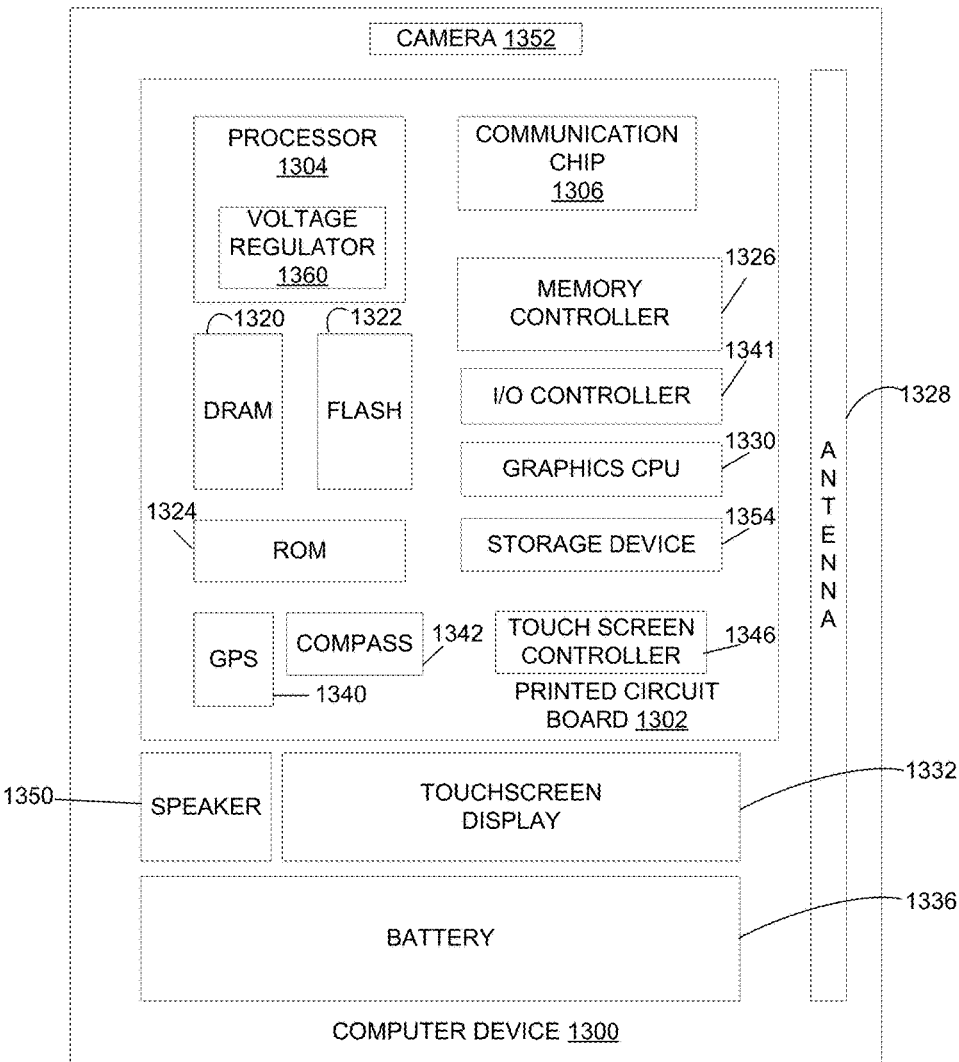
FIG. 13 illustrates an example computer device that may employ the apparatuses and/or methods described herein.

The microprocessor chip 203 may comprise a microprocessor and may include one or more of the features of the processor 1304 (FIG. 13). The microprocessor chip 203 may include an integrated voltage regulator 218. The voltage regulator 218 may be fully integrated within the microprocessor chip 203, which may be referred to as a fully integrated voltage regulator (FIVR). In some embodiments, the integrated voltage regulator may comprise a puck regulator. Having the voltage regulator 218 integrated within the microprocessor chip 203 may provide an increase in battery life, may provide an increase in peak available power, and/or may free up space on a motherboard to which the microprocessor chip 203 is mounted.

The voltage regulator 218 may receive power from a printed circuit board (PCB) (such as the PCB 1302 (FIG. 13)) at a first voltage and may convert the power to one or more other voltages for providing power to components within the microprocessor chip 203 and/or coupled to the microprocessor chip 203. The voltage regulator 218 may have an inductor to produce the conversion of power. In the illustrated embodiment, the coil produced by the first conductive element 208, the coil element 114a, and the second conductive element 214 may operate as the inductor for the voltage regulator 218. Further, the other coil elements 114 and corresponding conductive elements (such as the conductive elements 112, the first conductive element 208, and/or the second conductive element 214) may be coupled to the first conductive element 208, the coil element 114a, and the second conductive element 214 as part of the coil and may operate as part of the inductor for the voltage regulator 218.

The microprocessor chip 203 may further include programmable connections among the voltage regulator 218 and the conductive elements (such as the conductive elements 112, the first conductive element 208, and/or the second conductive element 214). For example, the microprocessor chip 203 may be programmed to couple the first conductive element 208 to the voltage regulator 218, to couple the second conductive element 214 to another of the conductive elements 112 coupled with a second coil element of the coil elements 114, and to couple the other one of the conductive elements 112 coupled with the second coil element to the voltage regulator 218. Accordingly, the coil element 114a and the second coil element may be connected in series and may cooperatively operate as the inductor for the voltage regulator 218. The microprocessor chip 203 may be able to couple one or more of the coil elements 114 in series to operate as the inductor of the voltage regulator 218, wherein the number of and/or the particular coil elements 114 to be coupled in series may be selected based on a desired output voltage.

In other embodiments, the substrate assembly 100 may include one or more traces that couple the coil elements 114 in series. In these embodiments, one of the conductive elements coupled to a first one of the coil elements 114 may be coupled to a voltage regulator 218, and one of the conductive elements coupled to a second one of the coil elements 114 may be coupled to the voltage regulator 218. Further, in these embodiments, all of the coil elements 114 may be connected in series to operate as the inductor for the voltage regulator 218. The number of coil elements 114 connected in series may not be adjustable in these embodiments, in contrast to the embodiments where the microprocessor chip 203 provides programmable connections among the coil elements 114.

A portion of the magnetic feature 102 may be located within the area defined by the loop formed by the first conductive element 208, the coil element 114a, and the second conductive element 214. Accordingly, the portion of the magnetic feature 102 may act as a core within the coil that includes the loop. As the magnetic feature 102 may provide higher magnetic permeability than the material of the base substrate 104, the magnetic feature 102 may provide improved performance of the inductor as compared to legacy substrates that do not include the magnetic feature 102. Further, the magnetic feature 102 may provide higher magnetic permeability than legacy magnetic films, which may provide improved performance of the inductor as compared to substrates that utilize legacy magnetic film. In particular, the legacy magnetic films may have a magnetic permeability of six, while the magnetic feature 102 may have a magnetic permeability of greater than six. In some embodiments, the magnetic permeability of the magnetic feature 102 may be greater than nine. The high magnetic permeability of the magnetic feature 102 may be due to being formed by a magnetic paste, as described in relation to FIG. 5.

Figure 3:
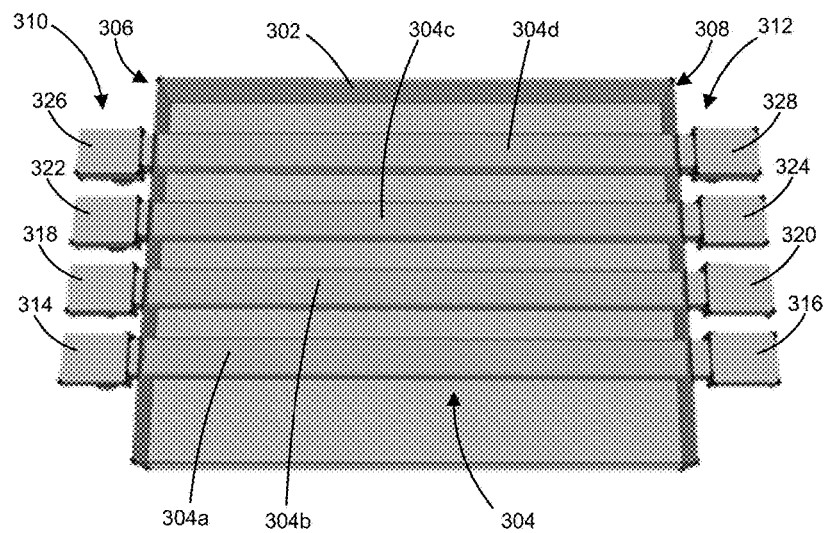
FIG. 3 illustrates a top view of an example magnetic feature with coil elements, according to various embodiments.

FIG. 3 illustrates a top view of an example magnetic feature 302 with coil elements 304, according to various embodiments. The magnetic feature 302 may include one or more of the features of the magnetic feature 102 (FIG. 1). The magnetic feature 302 may be implemented in a substrate assembly (such as the substrate assembly 100 (FIG. 1)) and may be located at a side of the substrate assembly opposite from a microprocessor chip with voltage regulator (such as the microprocessor chip 203 (FIG. 2) with the voltage regulator 218 (FIG. 2)). In particular, the magnetic feature 302 may be located on a side of a base substrate, such as the base substrate 104 (FIG. 1).

The coil elements 304 may extend through the magnetic feature 302 from a first side 306 of the magnetic feature 302 to a second side 308 of the magnetic feature 302. First portions 310 of each of the coil elements 304 may extend out of the magnetic feature 302 from the first side 306. Further, second portions 312 of each of the coil elements 304 may extend out of the magnetic feature 302 from the second side 308. Each of the first portions 310 and the second portions 312 may include a coupling element. The coupling elements may be utilized to couple the coil elements 304 to corresponding conductive elements (such as the conductive elements 112 (FIG. 1)) of the base substrate.

In the illustrated embodiments, the coil elements 304 may include a first coil element 304a, a second coil element 304b, a third coil element 304c, and a fourth coil element 304d. The first coil element 304a may include a first coupling element 314 located at a first end of the first coil element 304a and a second coupling element 316 located at a second end of the first coil element 304a, the second end opposite from the first end. The first coupling element 314 may couple the first coil element 304a to one of the conductive elements of the base substrate, and the second coupling element 316 may couple the first coil element 304a to another one of the conductive elements of the base substrate.

The second coil element 304b may include a third coupling element 318 located at a first end of the second coil element 304b and a fourth coupling element 320 located at a second end of the second coil element 304b, the second end opposite from the first end. The third coupling element 318 may couple the second coil element 304b to one of the conductive elements of the base substrate, and the fourth coupling element 320 may couple the second coil element 304b to another one of the conductive elements of the base substrate.

The third coil element 304c may include a fifth coupling element 322 located at a first end of the third coil element 304c and a sixth coupling element 324 located at a second end of the third coil element 304c, the second end opposite from the first end. The fifth coupling element 322 may couple the third coil element 304c to one of the conductive elements of the base substrate, and the sixth coupling element 324 may couple the third coil element 304c to another one of the conductive elements of the base substrate.

The fourth coil element 304d may include a seventh coupling element 326 located at a first end of the fourth coil element 304d and an eighth coupling element 328 located at a second end of the fourth coil element 304d, the second end opposite from the first end. The seventh coupling element 326 may couple the fourth coil element 304d to one of the conductive elements of the base substrate, and the eighth coupling element 328 may couple the fourth coil element 304d to another one of the conductive elements of the base substrate.

Figure 4:
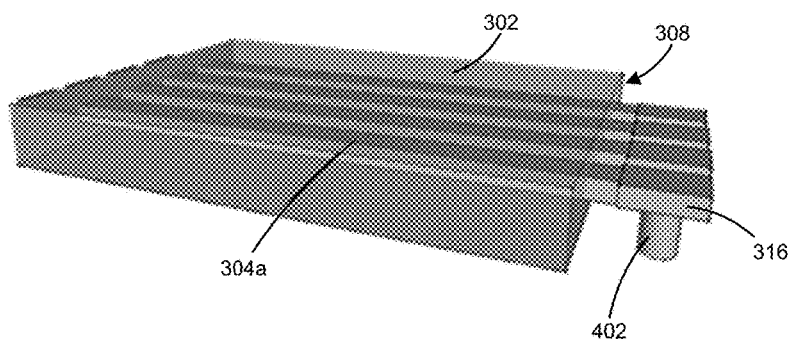
FIG. 4 illustrates a perspective view of the example magnetic feature with coil elements of FIG. 3, according to various embodiments.

FIG. 4 illustrates a perspective view of the example magnetic feature 302 with coil elements 304 of FIG. 3, according to various embodiments. In the illustrated embodiment, the second coupling element 316 of the first coil element 304a is shown extending from the second side 308 of the magnetic feature 302. The second coupling element 316 may include a post 402 that extends substantially (within five degrees) perpendicular to the portion of the first coil element 304a that extends through the magnetic feature 302. The post 402 may be utilized for coupling the first coil element 304a to a conductive element of a base substrate.

Each of the coupling elements may include a post (such as the post 402), which may be utilized for coupling each of coil elements to respective conductive elements of the base substrate. For example, the first coupling element 314 (FIG. 3), the third coupling element 318 (FIG. 3), the fourth coupling element 320 (FIG. 3), the fifth coupling element 322 (FIG. 3), the sixth coupling element 324 (FIG. 3), the seventh coupling element 326 (FIG. 3), and the eighth coupling element 328 (FIG. 3) may each include a post (such as the post 402). The posts of each of the coupling elements may extend in the same direction substantially (within five degrees) perpendicular to the portions of the coil elements that extend through the magnetic feature 302.

Figure 5:
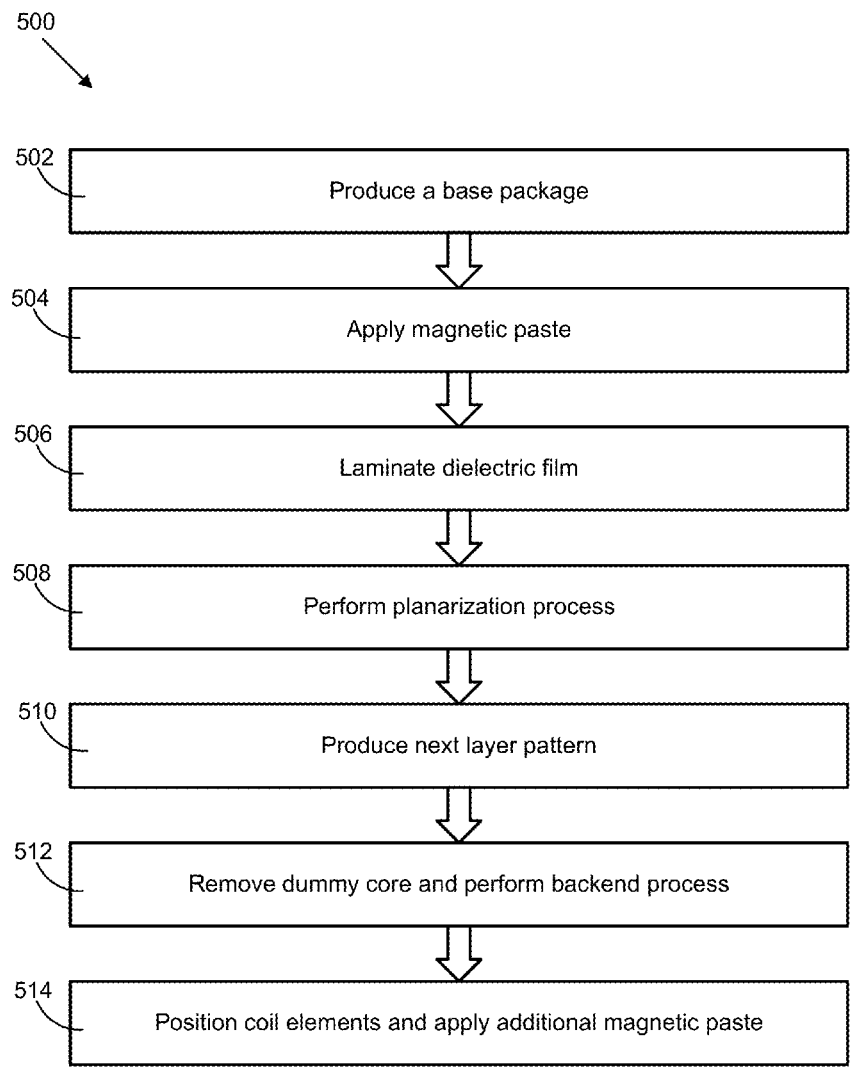
FIG. 5 illustrates an example procedure of producing a substrate assembly with a magnetic feature, according to various embodiments.

FIG. 5 illustrates an example procedure 500 of producing a substrate assembly with a magnetic feature, according to various embodiments. In particular, the procedure 500 may produce a substrate assembly that includes one or more of the features of the substrate assembly 100 (FIG. 1). Further, the magnetic feature produced by the procedure 500 may include one or more of the features of the magnetic feature 102 (FIG. 1).

In stage 502, a base substrate may be produced. In particular, one or more build-up films may be applied to a dummy core. The build-up films may comprise a dielectric material. In some embodiments, the build-up films may be epoxy-based. Production of the base substrate may further include forming one or more conductive elements within the build-up films.

Figure 6:
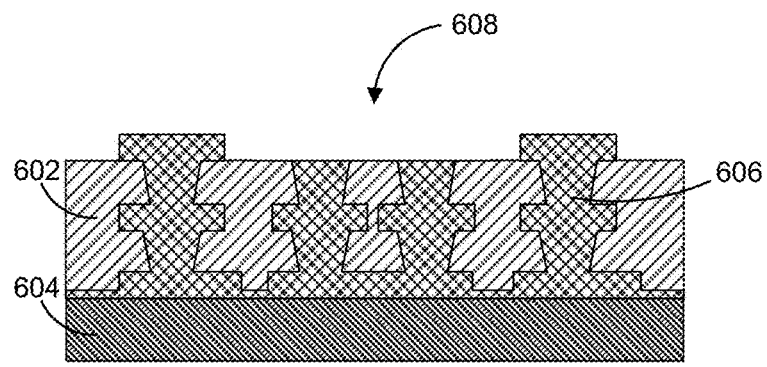
FIG. 6 illustrates a cross-sectional view of an example resultant base substrate in accordance with stage 502.

FIG. 6 illustrates a cross-sectional view of an example resultant base substrate 602 in accordance with stage 502. One or more build-up films may have been applied to the dummy core 604 to form the base substrate 602. The base substrate 602 may include one or more of the features of the base substrate 104 (FIG. 1).

Further, one or more of the conductive elements 606 may have been formed within the base substrate 602. The conductive elements 606 may include one or more of the features of the conductive elements 112 (FIG. 1). The conductive elements 606 may have been formed incrementally as each of the build-up films were applied to the dummy core 604. In particular, a first build-up film may have been applied to the dummy core 604, and then a drill procedure may have been performed to produce via recesses within the first build-up film that correspond to each of the conductive elements 606. An electroplating process may have then been performed to produce vias within the via recesses. An additional build-up film may have been applied to the first build-up film and the procedure may have been repeated until the base substrate 602 was a desired thickness. Each of the conductive elements 606 may be produced by one or more vias stacked on each other. The conductive elements 606, or some portion thereof, may form a pattern at the first side 608 of the base substrate 602.

In some embodiments, the drill procedure may have been performed incrementally as each of the build-up films were applied to the dummy core 604, but the electroplating process may have been performed only once a certain number of build-up films were applied to the dummy core 604. For example, a first build-up film may have been applied to the dummy core 604, and then a drill procedure may have been performed to produce via recesses within the first build-up film that correspond to each of the conductive elements 606. A second build-up film may have been applied to the first build-up film, and then another drill procedure may have been performed to produce via recesses within the second build-up film. An electroplating procedure may have then been performed to produce vias within the via recesses formed in the first build-up film and the second build-up film. Each of the conductive elements 606 may be produced by one or more vias stacked on each other.

In some embodiments, the build-up films may have been applied to the dummy core 604 prior to the formation of the conductive elements 606. For example, the build-up films may have been applied to produce the base substrate 602 of the desired thickness. Then a drill procedure may have been performed to produce via recesses for each of the conductive elements 606. An electroplating process may then be performed to produce conductive elements 606 in each of the via recesses.

In stage 504, a magnetic paste may be applied to a surface of the base substrate opposite to the dummy core. The magnetic paste may be applied to portions of the surface of the base substrate between the base substrate and locations where the coil elements (such as the coil elements 114 (FIG. 1)) are to be located. The magnetic paste may avoid being applied to another portion of the surface of the base substrate where the coil elements are not to be located. The magnetic paste may be applied to the pattern produced by the conductive elements and/or the surface of the base substrate. The magnetic paste may then be cured, such as by applying heat, light, chemicals, or some combination thereof, to the magnetic paste. Curing the magnetic paste may cause the magnetic paste to harden, and may produce a magnetic feature on the base substrate.

Figure 7:
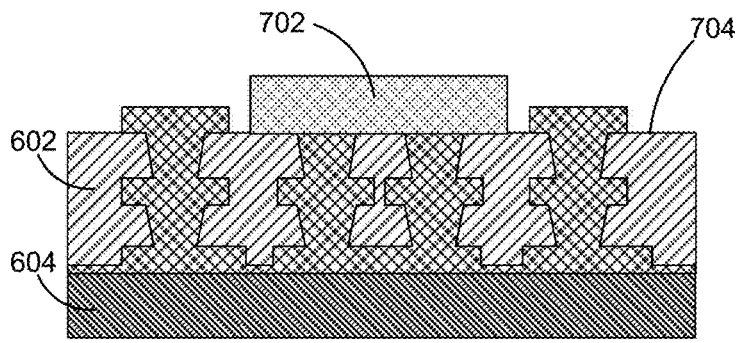
FIG. 7 illustrates a cross-sectional view of the resultant base substrate in accordance with stage 504.

FIG. 7 illustrates a cross-sectional view of the resultant base substrate 602 in accordance with stage 504. A magnetic feature 702 may have been formed on a surface 704 of the base substrate 602. The surface 704 may be located on an opposite side of the base substrate 602 from the dummy core 604. The magnetic feature 702 may cover a portion of the surface adjacent to where coil elements are to be located. In particular, the magnetic feature 702 may be located between the base substrate 602 and locations where the coil elements are to be located.

To produce the magnetic feature 702, magnetic paste may have been applied to the location of the magnetic feature 702. In particular, a mask may have been positioned on the surface 704 of the base substrate 602, the mask having an opening over the portion of the surface 704 on which the magnetic feature 702 was to be formed. The magnetic paste may then have been applied to the surface 704, where the mask may have prevented the magnetic paste from being applied on the surface 704 outside of the intended area. Once the magnetic paste has been applied, the mask may have been removed and the magnetic paste may have been cured to produce the magnetic feature 702.

In stage 506, one or more additional build-up films may be laminated to the base substrate. The additional build-up films may cover the magnetic feature. The base substrate and the additional build-up films may encapsulate the magnetic feature. The additional build-up films may comprise dielectric material. In some embodiments, the build-up films may be epoxy-based.

Figure 8:
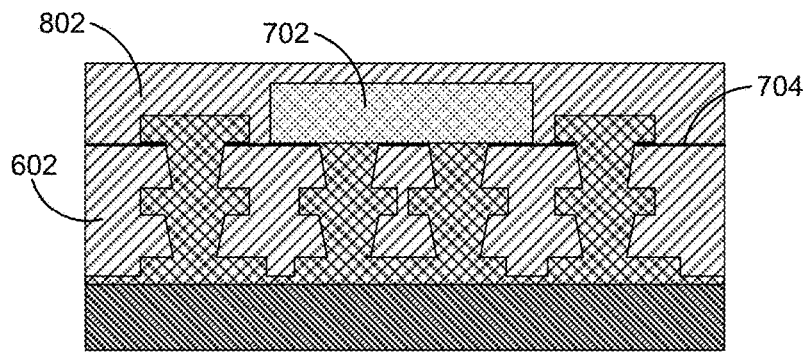
FIG. 8 illustrates a cross-sectional view of the resultant base substrate in accordance with stage 506.

FIG. 8 illustrates a cross-sectional view of the resultant base substrate 602 in accordance with stage 506. The base substrate 602 may have one or more build-up films 802 laminated to the surface 704 of the base substrate 602. The build-up films 802 may cover the magnetic feature 702, causing the magnetic feature 702 to be encapsulated by the base substrate 602 and the build-up films 802. The build-up films 802 may become a portion of the base substrate 602 when laminated.

In stage 508, a planarization process may be performed on the base substrate. The planarization process may result in the side of the base substrate at which the build-up films are located to be grinded to be planar. In particular, the planarization process may be performed to produce a desired thickness of the base substrate 602. The magnetic feature may be exposed by the planarization process.

Figure 9:
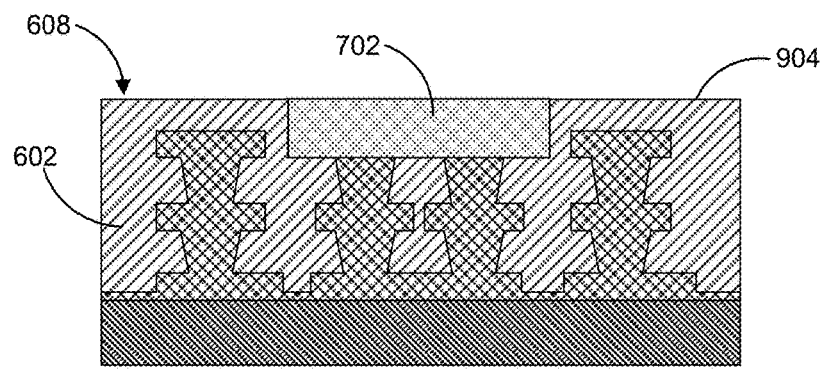
FIG. 9 illustrates a cross-sectional view of the resultant base substrate in accordance with stage 508.

FIG. 9 illustrates a cross-sectional view of the resultant base substrate 602 in accordance with stage 508. The first side 608 of the base substrate 602 may have been grinded to produce a planar surface 904. The magnetic feature 702 may be located at the planar surface 904 and may form a portion of the planar surface 904. The base substrate 602 may form the remainder of the planar surface 904.

In stage 510, a next layer pattern may be produced on the base substrate. In particular, the next layer pattern may be produced at the surface where the magnetic feature is located. Producing the next layer pattern may include forming one or more vias in the surface. The one or more vias may be formed on the conductive elements formed in the base substrate stage 502, thereby extending the conductive elements. The vias may be formed by a drilling process to produce via recesses within the base substrate and/or the magnetic feature. An electroplating process may then be applied to deposit conductive material within the via recesses to produce the vias.

Figure 10:
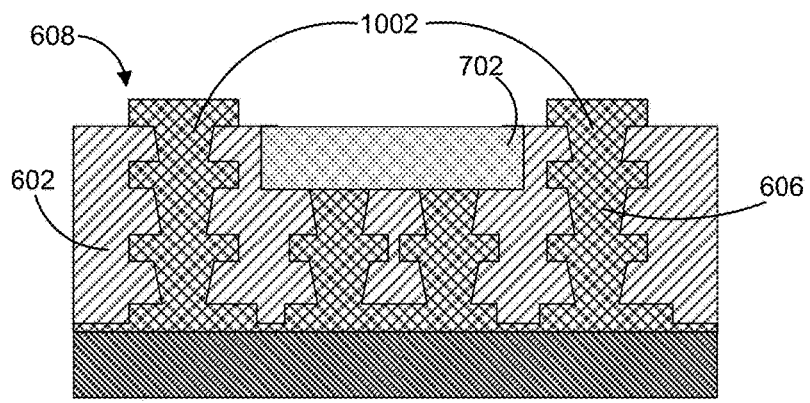
FIG. 10 illustrates a cross-sectional view of the resultant base substrate in accordance with stage 510.

FIG. 10 illustrates a cross-sectional view of the resultant base substrate 602 in accordance with stage 510. One or more vias 1002 may have been formed within the base substrate 602. The vias 1002 may have been formed on the conductive elements 606 and may extend the conductive elements 606, or some portion thereof, to the first side 608 of the base substrate 602. In some embodiments, one or more vias 1002 may further be formed within the magnetic feature 702.

In stage 512, the dummy core may be removed and a backend process may be performed. Once the dummy core has been removed, the backend process may include forming interconnect elements (such as the interconnect elements 106 (FIG. 1)) on the side of the base substrate where the dummy core was previously attached. The backend process may further include applying a surface finish (such as the surface finish 116 (FIG. 1)) to the side of the base substrate to which the dummy core was previously attached, wherein the surface finish may cover the side of the base substrate where the interconnect elements are not located. The backend process may further include applying the surface finish to the side of the base substrate where the magnetic feature is located, wherein the surface finish may cover the side of the base substrate where the conductive elements 606 and the magnetic feature are not located.

Figure 11:
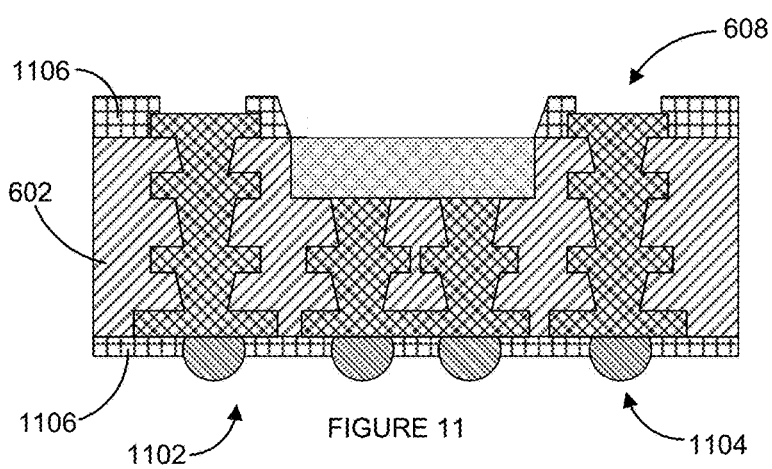
FIG. 11 illustrates a cross-sectional view of the resultant base substrate in accordance with stage 512.

FIG. 11 illustrates a cross-sectional view of the resultant base substrate 602 in accordance with stage 512. The dummy core 604 (FIG. 6) may have been removed from a second side 1102 of the base substrate 602. One or more interconnect elements 1104 may have been formed on the second side 1102 of the base substrate 602 where the dummy core 604 was previously located. The interconnect elements 1104 may include one or more of the features of the interconnect elements 106 (FIG. 1). The interconnect elements 1104 may have been formed adjacent to the conductive elements 606 and may be coupled to the conductive elements 606.

Further, surface finish 1106 may have been formed on the first side 608 and the second side 1102 of the base substrate 602. In particular, the surface finish 1106 may have been formed on the portions of the first side 608 of the base substrate 602 where the conductive elements 606 and the magnetic feature 702 are not located. Further, the surface finish 1106 may have been formed on the portions of the second side 1102 where the interconnect elements 1104 are not located.

In stage 514, one or more coil elements (such as the coil elements 114 (FIG. 1)) may be positioned over a surface of the base substrate where the magnetic feature is located. Further, additional magnetic paste may be applied to the surface of the base substrate where the magnetic feature is located, wherein the additional magnetic paste is applied on the magnetic feature and encapsulates a portion of the coil elements. The additional magnetic paste may be applied such that portions (such as the first portion 206 (FIG. 2) and the second portion 212 (FIG. 2)) extend out of the additional magnetic paste. The additional magnetic paste may then be cured, such as through application of heat, light, and/or chemicals, and become part of the magnetic feature.

Figure 12:
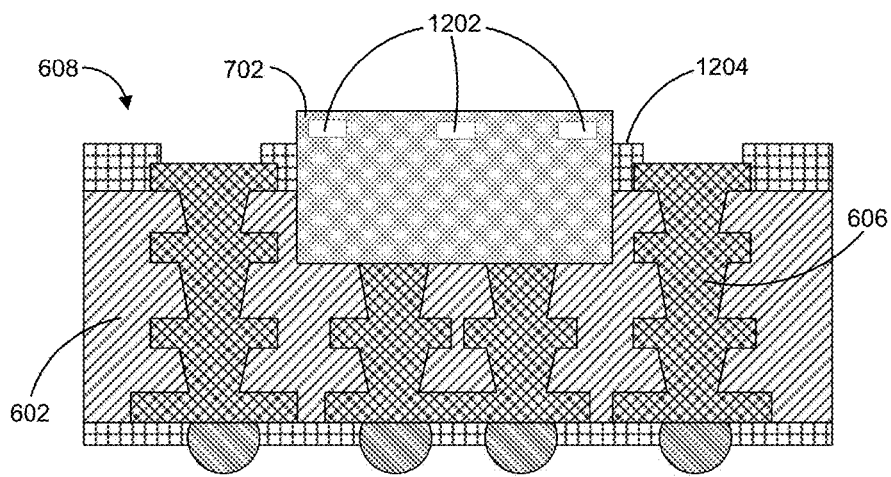
FIG. 12 illustrates a cross-sectional view of the resultant base substrate in accordance with stage 514.

FIG. 12 illustrates a cross-sectional view of the resultant base substrate 602 in accordance with stage 514. One or more coil elements 1202 may have been positioned over the previously formed portions of the magnetic feature 702, shown in FIG. 10, such that the previously formed portions of the magnetic feature 702 would be located between the coil elements 1202 and the base substrate 602. Further, the coil elements 1202 may have been coupled with one or more of the conductive elements 606, similar to the coupling of the coil element 114*a* to the first conductive element 208 and the second conductive element 214 shown and described in relation to FIG. 2.

Additional magnetic paste may have been applied to the first side 608 of the base substrate 602. The additional magnetic paste may have been applied on the previously formed portions of the magnetic feature 702 and on the conductive elements 606 that extended through the previously formed portions of the magnetic feature 702. A mask may have been positioned on the surface 1204 of the base substrate 602, the mask having an opening over the portion of the surface 1204 on which the additional magnetic paste was to be applied. The magnetic paste may then have been applied to the surface 1204, where the mask may have prevented the magnetic paste from being applied on the surface 1204 outside of the intended area. The additional magnetic paste may have encapsulated the coil elements 1202 with portions of the coil elements 1202 extending out of the first side and the second side of the additional magnetic paste, such as the first portions 310 extending out of the first side 306 and the second portions 312 extending out of the second side 308 shown and described in FIG. 3. Once the magnetic paste has been applied, the mask may have been removed and the additional magnetic paste may have been cured to produce the magnetic feature 702 shown in FIG. 12.

In some embodiments, the additional magnetic paste may not be applied. In these embodiments, the coil elements 1202 may be positioned over the previously formed portions of the magnetic feature 702, shown in FIG. 10, and may not be encapsulated by the magnetic feature 702.

FIG. 13 illustrates an example computer device 1300 that may employ the apparatuses and/or methods described herein (e.g., the substrate assembly 100), in accordance with various embodiments. As shown, computer device 1300 may include a number of components, such as one or more processor(s) 1304 (one shown) and at least one communication chip 1306. In various embodiments, the one or more processor(s) 1304 each may include one or more processor cores. The one or more processor(s) 1304 may further include one or more integrated voltage regulators 1360. The one or more integrated voltage regulator(s) 1360 may be fully integrated into the one or more processor(s) 1304. In various embodiments, the at least one communication chip 1306 may be physically and electrically coupled to the one or more processor(s) 1304. In further implementations, the communication chip 1306 may be part of the one or more processor(s) 1304. In various embodiments, computer device 1300 may include printed circuit board (PCB) 1302. For these embodiments, the one or more processor(s) 1304 and communication chip 1306 may be disposed thereon. In alternate embodiments, the various components may be coupled without the employment of PCB 1302.

Depending on its applications, computer device 1300 may include other components that may or may not be physically and electrically coupled to the PCB 1302. These other components include, but are not limited to, memory controller 1326, volatile memory (e.g., dynamic random access memory (DRAM) 1320), non-volatile memory such as read only memory (ROM) 1324, flash memory 1322, storage device 1354 (e.g., a hard-disk drive (HDD)), an I/O controller 1341, a digital signal processor (not shown), a crypto processor (not shown), a graphics processor 1330, one or more antenna 1328, a display (not shown), a touch screen display 1332, a touch screen controller 1346, a battery 1336, an audio codec (not shown), a video codec (not shown), a global positioning system (GPS) device 1340, a compass 1342, an accelerometer (not shown), a gyroscope (not shown), a speaker 1350, a camera 1352, and a mass storage device (such as hard disk drive, a solid state drive, compact disk (CD), digital versatile disk (DVD)) (not shown), and so forth.

In some embodiments, the one or more processor(s) 1304, flash memory 1322, and/or storage device 1354 may include associated firmware (not shown) storing programming instructions configured to enable computer device 1300, in response to execution of the programming instructions by one or more processor(s) 1304, to practice all or selected aspects of the methods described herein. In various embodiments, these aspects may additionally or alternatively be implemented using hardware separate from the one or more processor(s) 1304, flash memory 1322, or storage device 1354.

In various embodiments, the one or more processor(s) 1304 may include one or more of the substrate assemblies 100. In particular, processor(s) of the one or more processor(s) 1304 that include the one or more voltage regulator(s) 1360 may include the one or more substrate assemblies 100. In particular, the one or more substrate assemblies 100 may be implemented as an inductor of the one or more voltage regulator(s) 1360, wherein the one or more of the conductive elements 112 and the coil elements 114 may operate as a coil for the one or more voltage regulator(s) 1360.

The communication chips 1306 may enable wired and/or wireless communications for the transfer of data to and from the computer device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 1300 may include a plurality of communication chips 1306. For instance, a first communication chip 1306 may be dedicated to shorter range wireless communications such as Wi-Fi and Bluetooth, and a second communication chip 1306 may be dedicated to longer range wireless communications such as GPS, EDGE, GPRS, CDMA, WiMAX, LTE, Ev-DO, and others.

In various implementations, the computer device 1300 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 1300 may be any other electronic device that processes data.

Example 1 may include a substrate assembly, comprising a base substrate, one or more interconnect elements located at a first side of the base substrate, the one or more interconnect elements to be coupled to a semiconductor chip having an integrated voltage regulator (IVR), and a magnetic feature located at a second side of the base substrate, the second side being opposite to the first side, wherein the magnetic feature extends along a portion of the second side of the base substrate that is opposite to where the IVR is to be located when the semiconductor chip is coupled to the one or more interconnect elements.

Example 2 may include the substrate assembly of example 1, wherein a portion of the magnetic feature is to be located between the IVR and a portion of a coil associated with the IVR.

Example 3 may include the substrate assembly of examples 1 or 2, further comprising a coil to be coupled to the IVR, wherein a portion of the coil extends through the magnetic feature.

Example 4 may include the substrate assembly of example 3, wherein the magnetic feature encapsulates the portion of the coil.

Example 5 may include the substrate assembly of examples 1 or 2, wherein the magnetic feature includes a ferromagnetic material.

Example 6 may include the substrate assembly of examples 1 or 2, wherein the base substrate includes a copper pattern, and wherein the magnetic feature is located on the copper pattern.

Example 7 may include the substrate assembly of examples 1 or 2, wherein a portion of the magnetic feature extends from the second side of the base substrate into the base substrate.

Example 8 may include the substrate assembly of examples 1 or 2, further comprising the semiconductor chip having the IVR, the semiconductor chip coupled to the one or more interconnect elements, and a coil coupled to the IVR, wherein a portion of the magnetic feature is located between the IVR and a portion of the coil.

Example 9 may include the substrate assembly of example 8, wherein the portion of the coil extends through the magnetic feature.

Example 10 may include the substrate assembly of example 9, wherein the magnetic feature encapsulates the portion of the coil.

Example 11 may include the substrate assembly of examples 1 or 2, wherein the IVR is a fully integrated voltage regulator.

Example 12 may include the substrate assembly of examples 1 or 2, wherein the semiconductor chip is a microprocessor.

Example 13 may include a computer device, comprising a printed circuit board (PCB), a semiconductor chip coupled to the PCB, the semiconductor chip having an integrated voltage regulator (IVR), and a substrate assembly coupled to the semiconductor chip, wherein a coil extends around a portion of the substrate assembly, the substrate assembly including the coil coupled to the IVR, a base substrate, wherein the semiconductor chip is coupled to a first side of the base substrate, and a magnetic feature located at a second side of the base substrate, the second side being opposite to the first side, wherein the magnetic feature extends along a portion of the second side of the base substrate that is opposite to where the IVR is located.

Example 14 may include the computer device of example 13, wherein a portion of the magnetic feature is located between the IVR and a portion of the coil.

Example 15 may include the computer device of examples 13 or 14, wherein a portion of the coil extends through the magnetic feature.

Example 16 may include the computer device of example 15, wherein the magnetic feature encapsulates the portion of the coil.

Example 17 may include the computer device of examples 13 or 14, wherein the magnetic feature includes a ferromagnetic material.

Example 18 may include the computer device of examples 13 or 14, wherein the base substrate includes a copper pattern, and wherein the magnetic feature is located on the copper pattern.

Example 19 may include the computer device of examples 13 or 14, wherein a portion of the magnetic feature extends from the first side of the base substrate into the base substrate.

Example 20 may include the computer device of examples 13 or 14, wherein the IVR is a fully integrated voltage regulator.

Example 21 may include the computer device of examples 13 or 14, wherein the semiconductor chip is a microprocessor.

Example 22 may include a method of forming a substrate assembly for a semiconductor chip having an integrated voltage regulator (IVR), comprising forming a base substrate, forming a magnetic feature on a portion of a first side of the base substrate, wherein the portion of the first side is opposite to a portion of a second side of the base substrate to which the semiconductor chip is to be coupled, the second side being opposite to the first side, applying a build-up film to the first side of the base substrate, the build-up film to cover the magnetic feature, planarizing the first side of the base substrate to remove a portion of the build-up film on the magnetic feature and expose the magnetic feature, patterning the first side of the base substrate, and forming interconnect elements on the second side of the base substrate, wherein the semiconductor chip is to be coupled to the interconnect elements.

Example 23 may include the method of example 22, wherein forming the magnetic feature includes applying a magnetic paste to the portion of the first side of the base substrate, and curing the magnetic paste to produce the magnetic feature.

Example 24 may include the method of examples 22 or 23, wherein the portion of the build-up film is a first portion, and wherein planarizing the first side of the base structure further causes a second portion of the build-up film to be a target thickness, the second portion of the build-up film remaining on the first side of the base substrate after planarizing the first side.

Example 25 may include the method of examples 22 or 23, wherein the base substrate includes a dummy core located at the second side of the base substrate, and wherein forming the interconnect elements on the second side of the base substrate includes removing the dummy core from the base substrate, and forming the interconnect elements on the second side of the base substrate after the dummy core has been removed.

Example 26 may include the method of examples 22 or 23, further comprising positioning a portion of a coil adjacent to the magnetic feature, wherein the portion of the coil is located on the first side of the base structure, and wherein the coil is to couple to the IVR, applying a magnetic paste to the first side of the base substrate, wherein the magnetic paste is to contact the magnetic feature and encapsulate the portion of the coil, and curing the magnetic paste, wherein the magnetic paste that is cured becomes part of the magnetic feature.

Example 27 may include the method of examples 22 or 23, wherein the magnetic feature is formed on a copper pattern of the base substrate.

Example 28 may include the method of examples 22 or 23, wherein the magnetic feature includes a ferromagnetic material.

Example 29 may include the method of examples 22 or 23, wherein the semiconductor chip is a microprocessor.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A substrate assembly, comprising:
   a base substrate;
   one or more interconnect elements located at a first side of the base substrate, the one or more interconnect elements to be coupled to a semiconductor chip having an integrated voltage regulator (IVR); and
   a magnetic feature located at a second side of the base substrate, the second side being opposite to the first side, wherein the magnetic feature extends along a portion of the second side of the base substrate that is opposite to where the IVR is to be located when the semiconductor chip is coupled to the one or more interconnect elements, and wherein a portion of the magnetic feature is located between the IVR and a portion of a coil associated with the IVR, wherein the coil includes:
      a first conductive element that extends from the first side of the base substrate to the second side of the base substrate, wherein the first conductive element is located on a first side of the magnetic feature;
      a second conductive element that extends from the first side of the base substrate to the second side of the base substrate, wherein the second conductive element is located on a second side of the magnetic feature, the second side of the magnetic feature opposite to the first side of the magnetic feature; and
      a coil element that is coupled to the first conductive element and the second conductive element on the second side of the base substrate.

2. The substrate assembly of claim 1, further comprising the coil to be coupled to the IVR, wherein the portion of the coil extends through the magnetic feature.

3. The substrate assembly of claim 2, wherein the magnetic feature encapsulates the portion of the coil.

4. The substrate assembly of claim 1, wherein the magnetic feature includes a ferromagnetic material.

5. The substrate assembly of claim 1, wherein the base substrate includes a copper pattern, and wherein the magnetic feature is located on the copper pattern.

6. The substrate assembly of claim 1, wherein a second portion of the magnetic feature extends from the second side of the base substrate into the base substrate.

7. The substrate assembly of claim 1, further comprising:
   the semiconductor chip having the IVR, the semiconductor chip coupled to the one or more interconnect elements; and
   the coil coupled to the IVR, wherein the portion of the magnetic feature is located between the IVR and the portion of the coil.

8. The substrate assembly of claim 7, wherein the portion of the coil extends through the magnetic feature.

9. The substrate assembly of claim 1, wherein the IVR is a fully integrated voltage regulator.

10. A computer device, comprising:
    a printed circuit board (PCB);
    a semiconductor chip coupled to the PCB, the semiconductor chip having an integrated voltage regulator (IVR); and
    a substrate assembly coupled to the semiconductor chip, wherein a coil extends around a portion of the substrate assembly, the substrate assembly including:
    the coil coupled to the IVR;
      a base substrate, wherein the semiconductor chip is coupled to a first side of the base substrate; and
    a magnetic feature located at a second side of the base substrate, the second side being opposite to the first side, wherein the magnetic feature extends along a portion of the second side of the base substrate that is opposite to where the IVR is located, and wherein a portion of the magnetic feature is located between the IVR and a portion of the coil, wherein the coil includes:
      a first conductive element that extends from the first side of the base substrate to the second side of the base substrate, wherein the first conductive element is located on a first side of the magnetic feature;
      a second conductive element that extends from the first side of the base substrate to the second side of the base substrate, wherein the second conductive element is located on a second side of the magnetic feature, the second side of the magnetic feature opposite to the first side of the magnetic feature; and
      a coil element that is coupled to the first conductive element and the second conductive element on the second side of the base substrate.

11. The computer device of claim 10, wherein the portion of the coil extends through the magnetic feature.

12. The computer device of claim 11, wherein the magnetic feature encapsulates the portion of the coil.

13. The computer device of claim 10, wherein the magnetic feature includes a ferromagnetic material.

14. The substrate assembly of claim 1, wherein the magnetic feature is located at a first side of the substrate assembly opposite to a second side of the substrate assembly to which the semiconductor chip is to be coupled.

* * * * *